(12) United States Patent
Abe

(10) Patent No.: US 7,755,401 B2
(45) Date of Patent: Jul. 13, 2010

(54) SEMICONDUCTOR DEVICE INCLUDING DLL CIRCUIT, AND DATA PROCESSING SYSTEM

(75) Inventor: Tsuneo Abe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 17 days.

(21) Appl. No.: 12/289,137

(22) Filed: Oct. 21, 2008

(65) Prior Publication Data
US 2009/0102527 A1 Apr. 23, 2009

(30) Foreign Application Priority Data
Oct. 23, 2007 (JP) ............................. 2007-275470

(51) Int. Cl.
H03L 7/06 (2006.01)
(52) U.S. Cl. ..................... 327/149; 327/158; 327/161
(58) Field of Classification Search ................. 327/149, 327/158, 161, 261, 263, 264
See application file for complete search history.

(56) References Cited
U.S. PATENT DOCUMENTS
6,404,248 B1 * 6/2002 Yoneda ....................... 327/158

| 6,777,990 | B2 * | 8/2004 | Partsch et al. | 327/149 |
| 6,975,149 | B2 * | 12/2005 | Mikhalev et al. | 327/158 |
| 7,098,712 | B2 * | 8/2006 | Lee | 327/161 |
| 7,358,784 | B2 * | 4/2008 | Kim et al. | 327/158 |
| 7,388,415 | B2 * | 6/2008 | Lee | 327/158 |
| 2007/0210843 | A1 | 9/2007 | Takai | |

FOREIGN PATENT DOCUMENTS
JP 2007-243735 9/2007

* cited by examiner

Primary Examiner—Lincoln Donovan
Assistant Examiner—Hai Nguyen
(74) Attorney, Agent, or Firm—McGinn IP Law Group, PLLC

(57) ABSTRACT

A DLL circuit includes: a phase determining circuit that compares phases of respective rising edges of CK and LCLK to generate a determining signal R-U/D; a phase determining circuit that compares phases of respective falling edges of CK and LCLK to generate a determining signal F-U/D; a first adjusting circuit that adjusts a position of an active edge of LCLKR based on the determining signal R-U/D; a second adjusting circuit that adjusts a position of an active edge of LCLKF based on the determining signal F-U/D; a clock generating circuit that generates LCLK based on LCLKR and LCLKF; and a stop circuit that stops an adjusting operation by the second adjusting circuit in response to an adjusting direction of the active edge of LCLKR being opposite to each other to an adjusting direction of the active edge of LCLKF.

8 Claims, 5 Drawing Sheets

SEMICONDUCTOR DEVICE INCLUDING DLL CIRCUIT, AND DATA PROCESSING SYSTEM

BACKGROUND OF THE INVENTION

1. Field of the Invention

The present invention relates to a DLL (Delay Locked Loop) circuit and a semiconductor device including the same, and, more particularly relates to a DLL circuit capable of locking a high frequency clock signal and a semiconductor device including the same. The present invention also relates to a data processing system including such a semiconductor device.

2. Description of Related Art

In recent years, as a main memory for a personal computer or the like, a synchronous memory device that performs an operation synchronous with a clock signal is widely used. Particularly, in a DDR (Double Data Rate) synchronous memory device, there is a need of precisely synchronizing input/output data with an external clock signal, and thus a DLL circuit that generates an internal clock signal synchronous with the external clock signal is required. Japanese Patent Application Laid-open No. 2007-243735 discloses an example of such a DLL circuit.

The DLL circuit has a function of adjusting a position of a rising edge of the internal clock signal and a function of adjusting a position of a falling edge of the internal clock signal. With these functions, a phase of the external clock signal and that of the internal clock signal are matched. The rising edge of the internal clock signal is regulated by a Rise clock signal generated within the DLL circuit, and the falling edge of the internal clock signal is regulated by a Fall clock signal generated within the DLL circuit.

FIG. 5A is a timing chart for explaining an operation of the DLL circuit.

In an example in FIG. 5A, an active edge (in this example, a rising edge) of the Rise clock signal is advanced relative to the rising edge of an external clock signal CK. An active edge (in this example, a rising edge) of the Fall clock signal is delayed relative to the falling edge of the external clock signal CK. In this case, the phase of the Rise clock signal is adjusted in a delaying direction, and the phase of the Fall clock signal is adjusted to an advancing direction. The Rise clock signal and the Fall clock signal thus adjusted are combined within the DLL circuit, and thereby the internal clock signal is reproduced.

However, as in the example, when the phase of the Rise clock signal is adjusted in a delaying direction and the phase of the Fall clock signal is adjusted in an advancing direction, a clock width of the generated internal clock signal becomes small. That is, as compared to the clock width before the adjustment, the clock width of the internal clock signal is smaller by two pitches. Such a phenomenon does not cause a serious problem as far as a clock cycle for one adjustment pitch is sufficiently long. However, when a frequency of the external clock signal is high, and if the clock width of the internal clock signal becomes narrower by two pitches all at once, the clock width becomes too small, and thus it results in a short pulse, which can sometimes cause disappearance of the pulse.

Such a problem also occurs in a case contrary to the above example. That is, as shown in FIG. 5B, when the active edge of the Rise clock signal is delayed relative to the rising edge of the external clock signal CK and the active edge of the Fall clock signal is advanced relative to the falling edge of the external clock signal CK, the phase of the Rise clock signal is adjusted in an advancing direction and the phase of the Fall clock signal is adjusted in a delaying direction. In this case, the clock width of the generated internal clock signal is increased by two pitches all at once, as compared to the clock width before the adjustment. Accordingly, when the frequency of the external clock signal is high, the clock width of the internal clock signal becomes too large. As a result, a pulse on a low side is sometimes short-pulse, which can cause disappearance of the pulse.

Thus, in the conventional DLL circuit, when the adjusting direction of the Rise clock signal and the adjusting direction of the Fall clock signal are opposite to each other, there is a probability of disappearance of the pulse of the internal clock signal. When such a pulse disappearance occurs, the DLL circuit is not able to operate any longer, and thus the system requires resetting.

SUMMARY

The present invention seeks to solve one or more of the above problems, or to improve upon those problems at least in part.

In one embodiment, a semiconductor device has a DLL circuit, the DLL circuit comprising: a first phase determining circuit that compares a phase of a rising edge of a first clock signal and a phase of a rising edge of a second clock signal to generate a first determining signal; a second phase determining circuit that compares a phase of a falling edge of the first clock signal and a phase of a falling edge of the second clock signal to generate a second determining signal; a first adjusting circuit that adjusts a position of an active edge of a third clock signal based on the first determining signal; a second adjusting circuit that adjusts a position of an active edge of a fourth clock signal based on the second determining signal; a clock generating circuit that generates the second clock signal based on the third and fourth clock signals; and a stop circuit that stops one of adjusting operations by the first and second adjusting circuits in response to an adjusting direction of the active edge of the third clock signal based on the first determining signal and an adjusting direction of the active edge of the fourth clock signal based on the second determining signal being opposite to each other.

According to this embodiment, when the adjusting direction of the rising edge and the adjusting direction of the falling edge are opposite to each other, one of an adjusting operation of the rising edge and the adjusting operation of the falling edge is stopped, and thus it becomes possible to prevent a phenomenon in which the clock width is greatly changed all at once. Thus, even when the frequency of the clock signal is high, it becomes possible to decrease a risk of disappearance of the pulse.

It is preferable that the first adjusting circuit includes a first counter circuit whose count value is updated based on the first determining signal and a first delay circuit that delays the third clock signal based on the count value of the first counter circuit, and the second adjusting circuit includes a second counter circuit whose count value is updated based on the second determining signal and a second delay circuit that delays the fourth clock signal based on the count value of the second counter circuit. In this case, it is preferable that the first delay circuit includes a first coarse adjustment circuit having a relatively large adjusting pitch and a first fine adjustment circuit having a relatively small adjusting pitch, the second delay circuit includes a second coarse adjustment circuit having a relatively large adjusting pitch and a second fine adjustment circuit having a relatively small adjusting pitch, and the stop circuit stops one of an adjusting operations by the first and second coarse adjustment circuits. According thereto, it becomes possible to limit an adjusting operation, by the coarse adjustment circuit, which accompanies a risk of disappearance of the pulse.

It is preferable that the clock generating circuit includes a reproducing circuit that generates a fifth clock signal based on the third and fourth clock signals and a replica buffer that delays the fifth clock signal to generate the second clock signal. In this case, it is preferable that the semiconductor device further has an output buffer that outputs data to outside, wherein the fifth clock signal defines an operation timing-of the output buffer, and the replica buffer has a circuit configuration substantially identical to that of the output buffer. According thereto, it becomes possible to output data in synchronism with the first clock signal. Thus, as the first clock signal, an external clock signal is preferable.

As described above, according to the present invention, when a condition under which the clock width is changed greatly all at once is detected, one of the adjusting operation of the rising edge and the adjusting operation of the falling edge is stopped, and thus, even when the frequency of the clock signal is high, the pulse disappearance does not easily occur. Accordingly, it is preferable that the DLL circuit according to the present invention is incorporated in a semiconductor device that performs data input/output in synchronism with a high-speed clock signal, and more preferably it is incorporated in a DRAM.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will now be explained in detail with reference to the drawings.

Figure 1:
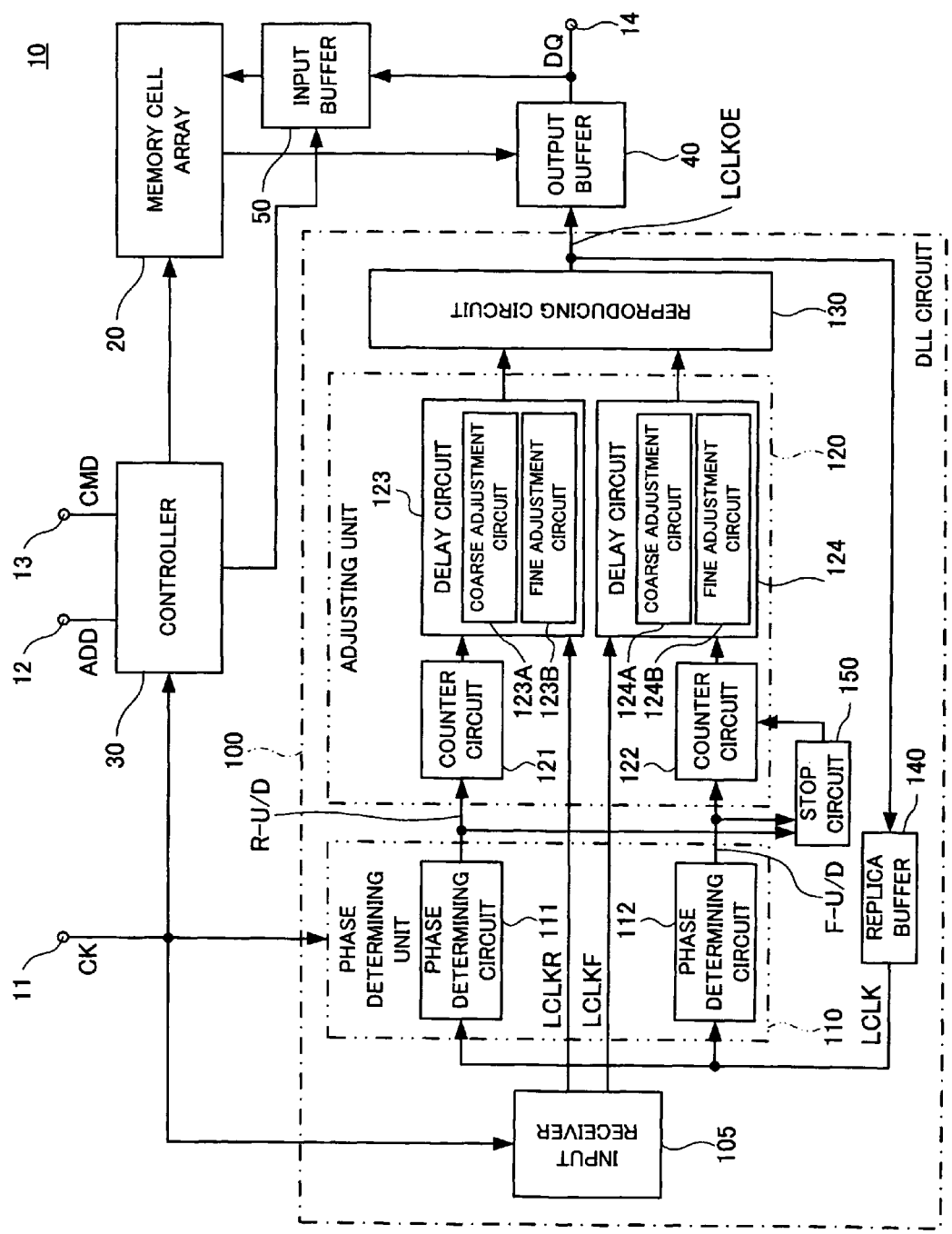
FIG. 1 is a block diagram of a semiconductor device including a DLL circuit according to a preferred embodiment of the present invention.

FIG. 1 is a block diagram of a semiconductor device including a DLL circuit according to an embodiment of the present invention. FIG. 1 is an example in which the DLL circuit is incorporated in a DRAM provided in a data processing system such as a personal computer.

The semiconductor device 10 shown in FIG. 1 includes a memory cell array 20, a controller 30 that performs access control to and from the memory cell array 20, an output buffer 40 that outputs data read from the memory cell array 20 to outside, an input buffer 50 that temporarily stores data inputted from outside, and a DLL circuit 100 that synchronizes an output timing of data from the output buffer 40 with an external clock signal CK.

In the semiconductor device 10, there are arranged at least a clock terminal 11, an address terminal 12, a command terminal 13, and a data input/output terminal 14, as external terminals. The clock terminal 11 is inputted the external clock signal CK. The external clock signal CK is supplied to the controller 30 and the DLL circuit 100. The address terminal 12 and the command terminal 13 are inputted an address signal ADD and a command signal CMD, respectively, and the address signal ADD and command signal CMD are supplied to the controller 30.

When the command signal CMD indicates a read operation, the controller 30 accesses data stored in an address designated by the address signal ADD out of data stored in the memory cell array 20, and supplies the data to the output buffer 40. Read data DQ supplied to the output buffer 40 is outputted from the data input/output terminal 14 in synchronism with the external clock signal CK under the control of the DLL circuit 100. On the other hand, when the command signal CMD indicates a write operation, write data DQ inputted to the data input/output terminal 14 is fetched via the input buffer 50 and written into an address designated by the address signal ADD in the memory cell array 20.

These operations by the controller 30 are performed in synchronous with various internal clock signals (not shown) generated based on the external clock signal CK.

A circuit configuration of the DLL circuit 100 is described next.

As shown in FIG. 1, the DLL circuit 100 includes an input receiver 105 that generates an internal clock signal LCLKR (Rise clock signal) and an internal clock signal LCLKF (Fall clock signal) based on the external clock signal CK, a phase determining unit 110 that generates determination signals R-U/D and F-U/D by comparing phases of the external clock signal CK and the internal clock signal LCLK, an adjusting unit 120 that adjusts positions of active edges (rising edges) of the internal clock signals LCLKR and LCLKF based on the determination signals R-U/D and F-U/D, a reproducing circuit 130 that generates an internal clock signal LCLKOE based on the internal clock signals LCLKR and LCLKF, a replica buffer 140 that generates the internal clock signal LCLK by delaying the internal clock signal LCLKOE, and a stop circuit 150 that stops an adjusting operation of the adjusting unit 120, as needed. In the present specification, the reproducing circuit 130 and the replica buffer 140 can be collectively called a "clock generating circuit".

The phase determining unit 110 is configured by phase determining circuits 111 and 112.

The phase determining circuit 111 compares phases of the rising edge of the external clock signal CK and the rising edge of the internal clock signal LCLK to generate a determination signal R-U/D. Specifically, when the rising edge of the internal clock signal LCLK is delayed relative to the rising edge of the external clock signal CK, the determination signal R-U/D is set to a low level, whereas when the rising edge of the internal clock signal LCLK is advanced relative to the rising edge of the external clock signal CK, the determination signal R-U/D is set to a high level.

The phase determining circuit 112 compares phases of the falling edge of the external clock signal CK and the falling edge of the internal clock signal LCLK to generate the determination signal F-U/D. Specifically, when the falling edge of the internal clock signal LCLK is delayed relative to the falling edge of the external clock signal CK, the determination signal F-U/D is set to a low level, whereas when the falling edge of the internal clock signal LCLK is advanced relative to the falling edge of the external clock signal CK, the determination signal F-U/D is set to a high level.

The adjusting unit 120 includes a counter circuit 121 of which the count value is updated based on the determination signal R-U/D, a counter circuit 122 of which the count value is updated based on the determination signal F-U/D, a delay circuit 123 that delays the internal clock signal LCLKR generated by the input receiver 105 based on the count value of the counter circuit 121, and a delay circuit 124 that delays the internal clock signal LCLKF generated by the input receiver 105 based on the count value of the counter circuit 122. In the present specification, the counter circuit 121 or 122 and the delay circuit 123 or 124 can be collectively called an "adjusting circuit".

The counter circuits 121 and 122 count down when the corresponding determination signal R-U/D or F-U/D is at a low level, and count up when it is at a high level. The greater the count values of the corresponding counter circuits 121 and 122, the more the delay circuits 123 and 124 increase a delay amount of the corresponding internal clock signals LCLKR and LCLKF. In the present embodiment, the delay circuit 123 includes a coarse adjustment circuit 123a, which has a relatively large adjusting range, and a fine adjustment circuit 123b, which has a relatively small adjusting range. In addition, the delay circuit 124 includes a coarse adjustment circuit 124a, which has a relatively large adjusting range, and a fine adjustment circuit 124b, which has a relatively small adjusting range.

The coarse adjustment circuits 123a and 124a are used to perform a rough adjustment in a period during which the DLL circuit 100 is not locked, such as immediately after applying power to the semiconductor device 10. This is followed by a fine adjustment using the fine adjustment circuits 123b and 124b, which brings the DLL circuit 100 into a locked state.

The reproducing circuit 130 generates the internal clock signal LCLKOE based on the internal clock signals LCLKR and LCLKF that undergo the adjustment by the adjusting unit 120. Specifically, the rising edge of the internal clock signal LCLKR is set to the rising edge of the internal clock signal LCLKOE, and the rising edge of the internal clock signal LCLKF is set to the falling edge of the internal clock signal LCLKOE. The internal clock signal LCLKOE generated by the reproducing circuit 130 is inputted to the output buffer 40 and the replica buffer 140.

The output buffer 40 outputs the read data DQ supplied from the memory cell array 20 from the data input/output terminal 14 in synchronous with the internal clock signal LCLKOE. The read data DQ is thereby outputted from the data input/output terminal 14 in synchronous with the external clock signal CK. In other words, the internal clock signal LCLKOE defines an operational timing of the output buffer 40 for outputting the read data DQ to outside.

On the other hand, the replica buffer 140 has a circuit configuration substantially identical to that of the output buffer 40 and adds an operating delay by the output buffer 40 to the internal clock signal LCLKOE to generate the internal clock signal LCLK. Thereby, the internal clock signal LCLK generated by the replica buffer 140 becomes a signal completely synchronized with the read data DQ.

The stop circuit 150 temporarily stops an operation of the counter circuit 122 in response to the adjusting direction of the active edge of the internal clock signal LCLKR based on the determination signal R-U/D being opposite to each other to the adjusting direction of the active edge of the internal clock signal LCLKF based on the determination signal F-U/D. Accordingly, when the adjusting directions of the internal clock signals LCLKR and LCLKF are opposite to each other, only the counter circuit 121 updates its count value while the count value of the counter circuit 122 is fixed. In contrast, when the adjusting directions of the internal clock signals LCLKR and LCLKF are both the same, both of the counter circuits 121 and 122 update their count values. For the stop circuit 150, for example, an exclusive nonlogical OR (XNOR) circuit can be used.

Thus, a configuration of the semiconductor device 10 is described. An operation of the semiconductor device 10 is described next.

Figure 2:
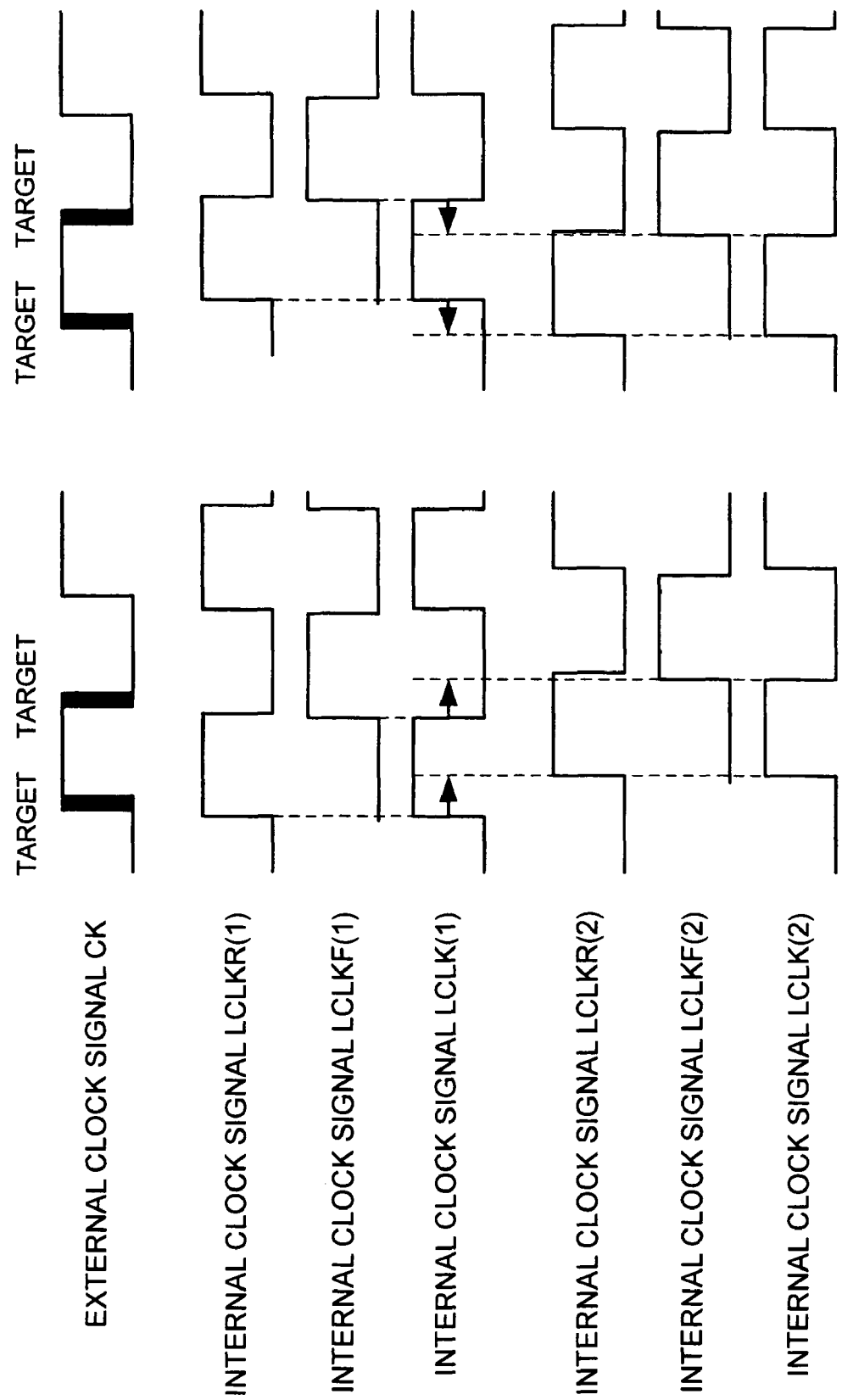
FIGS. 2A and 2B are timing diagrams for explaining an operation of the DLL circuit shown in FIG. 1 when the adjusting directions of the internal clock signals are both the same.

FIGS. 2A and 2B are timing diagrams for explaining an operation of the DLL circuit 100 when the adjusting directions of the internal clock signals LCLKR and LCLKF are both the same. In FIGS. 2A and 2B, signals marked with (1) indicate internal clock signals before the adjustment, and signals marked with (2) indicate internal clock signals after the adjustment (the same applies in FIGS. 3A and 3B).

In an example shown in FIG. 2A, the rising edge of the internal clock signal LCLK before the adjustment is advanced compared to the rising edge of the external clock signal CK. Accordingly, the determination signal R-U/D is at a high level and so controls the counter circuit 121 to delay the phase of the internal clock signal LCLKR. In addition, the falling edge of the internal clock signal LCLK before the adjustment is also advanced compared to the rising edge of the external clock signal CK. Accordingly, the determination signal F-U/D is also at a high level and so controls the counter circuit 122 to delay the phase of the internal clock signal LCLKF. In this way, the adjusting directions of the internal clock signals LCLKR and LCLKF are both the same.

Accordingly, the stop circuit 150 is not activated and both of the counter circuits 121 and 122 update their count values. That is, both of the counter circuits 121 and 122 that receive the determination signals count up and delay the phases of the internal clock signal LCLKR and the internal clock signal LCLKF by one pitch. As a result, both the rising edge and the falling edge of the internal clock signal LCLK generated by the clock generating circuit are delayed compared to the edges before the adjustment.

On the other hand, in the example shown in FIG. 2B, the rising edge of the internal clock signal LCLK before the adjustment is delayed compared to the rising edge of the external clock signal CK. Accordingly, the determination signal R-U/D is at a low level and so controls the counter circuit 121 to advance the phase of the internal clock signal LCLKR. In addition, the falling edge of the internal clock signal LCLK before the adjustment also is delayed compared to the rising edge of the external clock signal CK. Accordingly, the determination signal F-U/D also is at a low level and so controls the counter circuit 122 to advance the phase of the internal clock signal LCLKF. In this way, the adjusting directions of the internal clock signals LCLKR and LCLKF are both the same.

Accordingly, the stop circuit 150 is not activated and both of the counter circuits 121 and 122 update their count values. That is, both of the counter circuits 121 and 122 that receive the determination signals count down and advance the phases of the internal clock signal LCLKR and the internal clock signal LCLKF by one pitch. As a result, both the rising edge and the falling edge of the internal clock signal LCLK generated by the clock generating circuit are advanced compared to the edges before the adjustment.

In this way, when the adjusting directions of the internal clock signals LCLKR and LCLKF are both the same, both of the counter circuits 121 and 122 update their count values.

Figure 3:
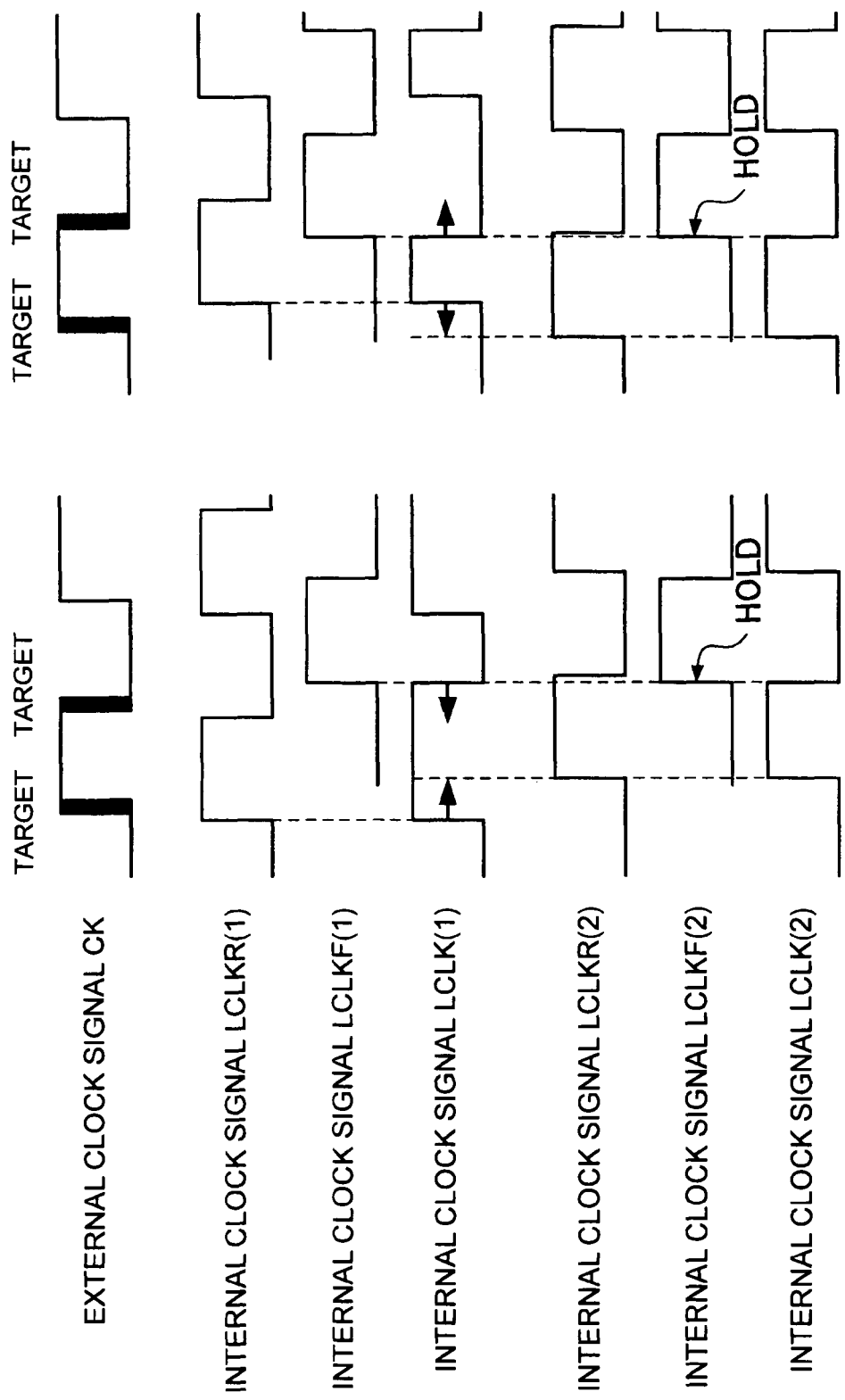
FIGS. 3A and 3B are timing diagrams for explaining an operation of the DLL circuit shown in FIG. 1 when the adjusting directions of the internal clock signals are opposite to each other.

FIGS. 3A and 3B are timing diagrams for explaining an operation of the DLL circuit 100 when the adjusting directions of the internal clock signals LCLKR and LCLKF are opposite to each other.

In an example shown in FIG. 3A, the rising edge of the internal clock signal LCLK before the adjustment is advanced compared to the rising edge of the external clock signal CK. Accordingly, the determination signal R-U/D is at a high level and so controls the counter circuit 121 to delay the phase of the internal clock signal LCLKR. In contrast, the falling edge of the internal clock signal LCLK before the adjustment is delayed compared to the rising edge of the external clock signal CK. Accordingly, the determination signal F-U/D is at a low level and so controls the counter circuit 122 to advance the phase of the internal clock signal LCLKF. In this way, the adjusting directions of the internal clock signals LCLKR and LCLKF are opposite to each other.

Figure 5A:
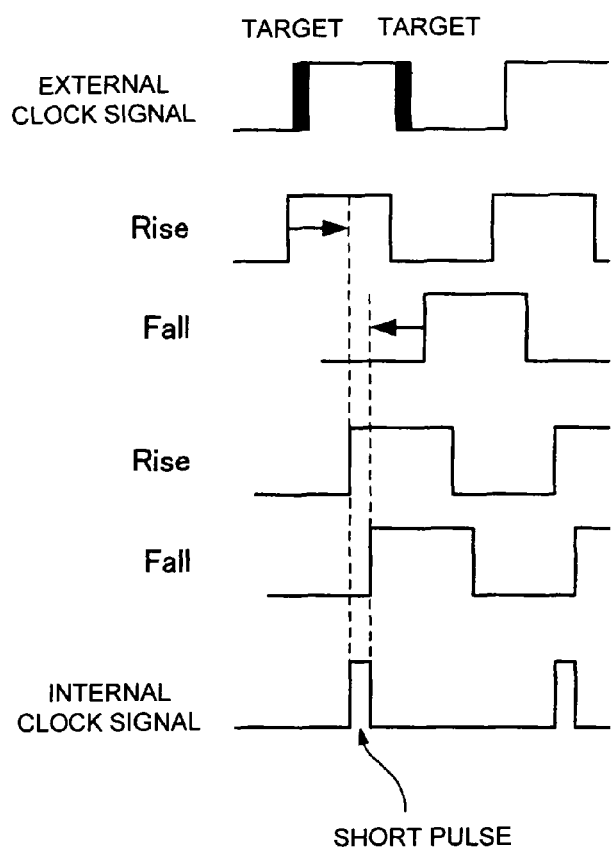
FIGS. 5A and 5B are timing charts for explaining an operation of a conventional DLL circuit.

Thus, the stop circuit 150 is activated, and temporarily stops the operation of the counter circuit 122. As a result, only counting up of the counter circuit 121 is performed and the phase of the internal clock signal LCLKR is delayed by one pitch while a delay amount of the internal clock signal LCLKF remains fixed. Accordingly, the clock width of the internal clock signal LCLK is decreased by only one pitch compared to the clock width before the adjustment, and thus it is less likely that the clock width is too small unlike in the background technology shown in FIG. 5A.

On the other hand, in an example shown in FIG. 3B, the rising edge of the internal clock signal LCLK before the adjustment is delayed compared to the rising edge of the external clock signal CK. Accordingly, the determination signal R-U/D is at a low level and so controls the counter circuit 121 to advance the phase of the internal clock signal LCLKR. In contrast, the falling edge of the internal clock signal LCLK before the adjustment is advanced compared to the rising edge of the external clock signal CK. Accordingly, the determination signal F-U/D is at a high level and so controls the counter circuit 122 to delay the phase of the internal clock signal LCLKF. In this way, the adjusting directions of the internal clock signals LCLKR and LCLKF are opposite to each other.

Figure 5B:
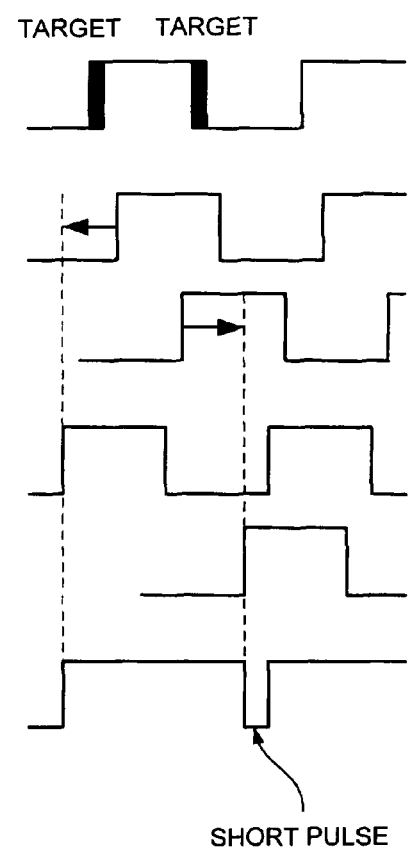

Thus, the stop circuit 150 is activated, and temporarily stops the operation of the counter circuit 122. As a result, only counting down of the counter circuit 121 is performed and the phase of the internal clock signal LCLKR is advanced by one pitch while the delay amount of the internal clock signal LCLKF remains fixed. Accordingly, the clock width of the internal clock signal LCLK is increased by only one pitch compared to before the adjustment, and thus it is less likely that the clock width is too large as shown in the background technology in FIG. 5B.

The stopping operation by the stop circuit 150 can be performed only when each adjusting circuit is performing the adjusting operation using the coarse adjustment circuit. This is because short pulses rarely occur even when the adjusting directions of the internal clock signals LCLKR and LCLKF are opposite to each other since the adjusting pitch is small in the adjustment by the fine adjustment circuit. However, the stop operation can be performed also when the adjusting operation is performed using the fine adjustment circuit.

As described above, according to the semiconductor device 10, it is possible to prevent the clock width of the internal clock signal LCLK from being too large or too small, so even when the frequency of the clock signal is high compared to the frequency in the background technology, there is a lower risk of the pulse disappearance.

Figure 4:
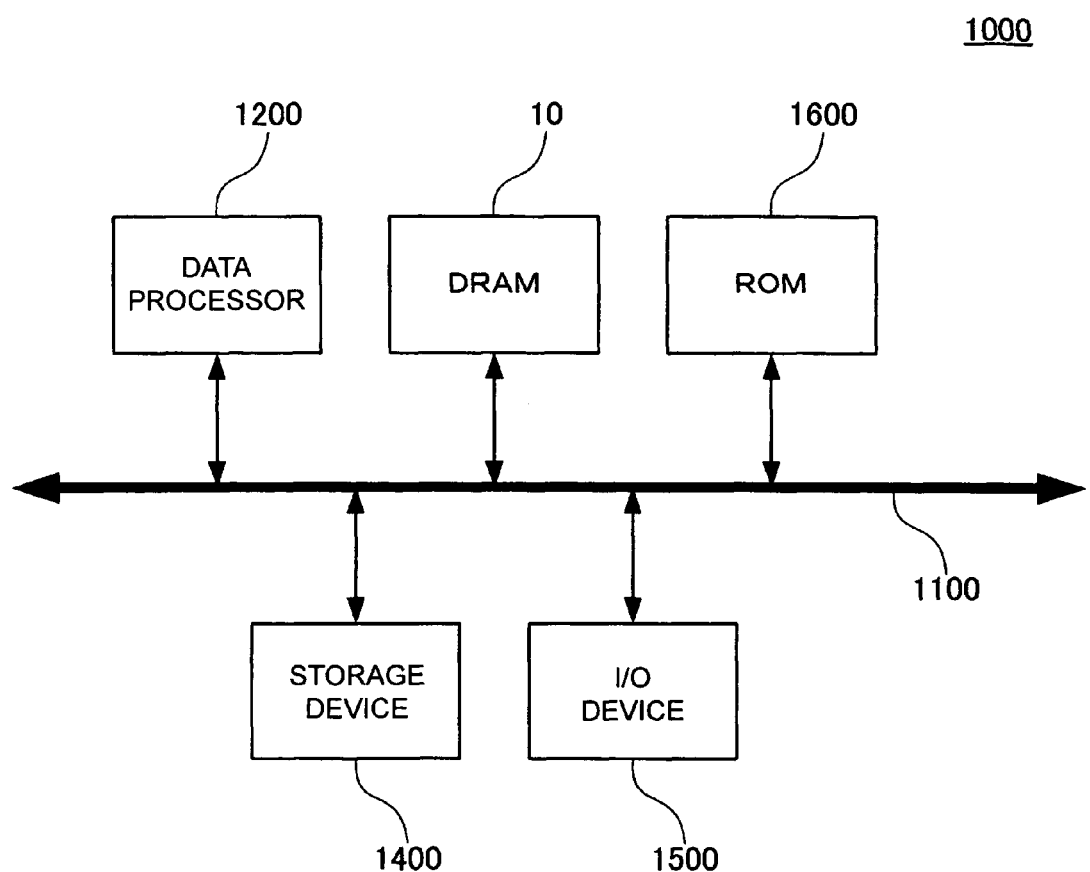
FIG. 4 is a block diagram showing a configuration of a data processing system using the semiconductor device, and shows a case that the semiconductor device is a DRAM.

FIG. 4 is a block diagram showing a configuration of a data processing system 1000 using the semiconductor device, and shows a case that the semiconductor device is a DRAM.

The data processing system 1000 shown in FIG. 4 has a configuration such that a data processor 1200 and a semiconductor device (DRAM) 10 according to the present embodiment are mutually connected via a system bus 1100. Examples of the data processor 1200 include, but are not limited to, a microprocessor (MPU) and a digital signal processor (DSP). In FIG. 4, for the sake of simplicity, the data processor 1200 and DRAM 10 are connected via the system bus 1100. However, these can be connected via a local bus without using the system bus 1100.

In FIG. 4, for the sake of simplicity, only one set of the system bus 1100 is shown. However, the system bus 1100 can be arranged via a connector or the like in series or in parallel, where appropriate. In a memory-system data processing system shown in FIG. 4, while a storage device 1400, an I/O device 1500, and a ROM 1600 are connected to the system bus 1100, these components are not necessarily essential constituent elements.

Examples of the storage device 1400 can include a hard disk drive, an optical disk drive, and a flash memory. Examples of the I/O device 1500 can include a display device such as a liquid crystal display, and an input device such as a keyboard and a mouse. Regarding the I/O device 1500, it is only necessary to arrange either one of the input device or the output device. For the sake of simplicity, each constituent element shown in FIG. 4 is shown one each. However, the number is not limited to one, and a plurality of one or two or more constituent elements can be arranged.

The present invention is in no way limited to the aforementioned embodiments, but rather various modifications are possible within the scope of the invention as recited in the claims, and naturally these modifications are included within the scope of the invention.

For example, in the above embodiment, when the adjusting directions of the internal clock signals LCLKR and LCLKF are opposite to each other, the operation of the counter circuit 122 is stopped by the stop circuit 150. However, the operation of the counter circuit 121 can be stopped instead of the counter circuit 122. However, for the phase determining circuit 112 that detects the falling edge of the internal clock signal LCLK, a DCC circuit (Duty Correction Circuit) can be used. The DCC circuit utilizes the rising edge of the internal clock signal LCLK, and thus, when the operation of the counter circuit 121 is stopped, an operation of the DCC circuit also becomes deviated. Considering these points, it is preferable that the operation of the counter circuit 122 be stopped by the stop circuit 150 as described in the embodiment.

Whether the stopping operation by the stop circuit 150 can be executed can be set by a command inputted from outside. As a result, when it is not necessary to cause the stop circuit to function, such as when the frequency of the external clock signal CK is low, it becomes possible to reduce the locking time of the DLL circuit 100.

What is claimed is:

1. A semiconductor device having a DLL circuit, the DLL circuit comprising:
   a first phase determining circuit that compares a phase of a rising edge of a first clock signal and a phase of a rising edge of a second clock signal to generate a first determining signal;
   a second phase determining circuit that compares a phase of a falling edge of the first clock signal and a phase of a falling edge of the second clock signal to generate a second determining signal;

a first adjusting circuit that adjusts a position of an active edge of a third clock signal based on the first determining signal;

a second adjusting circuit that adjusts a position of an active edge of a fourth clock signal based on the second determining signal;

a clock generating circuit that generates the second clock signal based on the third and fourth clock signals; and a stop circuit that stops one of adjusting operations by the first and second adjusting circuits in response to an adjusting direction of the active edge of the third clock signal based on the first determining signal and an adjusting direction of the active edge of the fourth clock signal based on the second determining signal being opposite to each other.

2. The semiconductor device as claimed in claim 1, wherein the first adjusting circuit includes a first counter circuit whose count value is updated based on the first determining signal and a first delay circuit that delays the third clock signal based on the count value of the first counter circuit, and the second adjusting circuit includes a second counter circuit whose count value is updated based on the second determining signal and a second delay circuit that delays the fourth clock signal based on the count value of the second counter circuit.

3. The semiconductor device as claimed in claim 2, wherein the first delay circuit includes a first coarse adjustment circuit having a relatively large adjusting pitch and a first fine adjustment circuit having a relatively small adjusting pitch, the second delay circuit includes a second coarse adjustment circuit having a relatively large adjusting pitch and a second fine adjustment circuit having a relatively small adjusting pitch, and the stop circuit stops one of an adjusting operations by the first and second coarse adjustment circuits.

4. The semiconductor device as claimed in claim 1, wherein the clock generating circuit includes a reproducing circuit that generates a fifth clock signal based on the third and fourth clock signals and a replica buffer that delays the fifth clock signal to generate the second clock signal.

5. The semiconductor device as claimed in claim 4, further having an output buffer that outputs data to outside, wherein the fifth clock signal defines an operation timing of the output buffer, and the replica buffer has a circuit configuration substantially identical to that of the output buffer.

6. The semiconductor device as claimed in claim 1, wherein the first clock signal is an external clock signal.

7. A data processing system including a data processor and a semiconductor memory device having a DLL circuit, the DLL circuit comprising:

a first phase determining circuit that compares a phase of a rising edge of a first clock signal and a phase of a rising edge of a second clock signal to generate a first determining signal;

a second phase determining circuit that compares a phase of a falling edge of the first clock signal and a phase of a falling edge of the second clock signal to generate a second determining signal;

a first adjusting circuit that adjusts a position of an active edge of a third clock signal based on the first determining signal;

a second adjusting circuit that adjusts a position of an active edge of a fourth clock signal based on the second determining signal;

a clock generating circuit that generates the second clock signal based on the third and fourth clock signals; and a stop circuit that stops one of adjusting operations by the first and second adjusting circuits in response to an adjusting direction of the active edge of the third clock signal based on the first determining signal and an adjusting direction of the active edge of the fourth clock signal based on the second determining signal being opposite to each other.

8. A semiconductor device with a clock generator generating an internal clock signal in response to an external clock signal, the clock generator comprising an adjusting unit operating to shift a rising edge of the internal clock signal in either forward and backward directions and to shift a falling edge of the internal clock signal in either forward and backward directions, and a stopping circuit controlling the adjusting unit to stop an operation of shifting one of the rising and falling edge of internal clock signal when both of the rising and falling edges of the internal clock are to be shifted in opposite directions to each other.

* * * * *